United States Patent
Kumar et al.

(10) Patent No.: US 10,505,562 B2
(45) Date of Patent: Dec. 10, 2019

(54) CIRCUIT AND METHOD FOR GENERATING REFERENCE SIGNALS FOR HYBRID ANALOG-TO-DIGITAL CONVERTORS

(71) Applicant: STMicroelectronics International N.V., Schiphol (NL)

(72) Inventors: Ashish Kumar, Ghaziabad (IN); Chandrajit Debnath, Greater Noida (IN); Pratap Narayan Singh, Benares (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 16/227,495

(22) Filed: Dec. 20, 2018

(65) Prior Publication Data

US 2019/0123759 A1    Apr. 25, 2019

Related U.S. Application Data

(63) Continuation of application No. 16/031,753, filed on Jul. 10, 2018, now Pat. No. 10,171,100, which is a
(Continued)

(30) Foreign Application Priority Data

Sep. 8, 2016    (IN) .............................. 201611030760

(51) Int. Cl.
*H03M 1/46*    (2006.01)
*H03M 1/38*    (2006.01)
(Continued)

(52) U.S. Cl.
CPC ......... *H03M 1/466* (2013.01); *H03M 1/0863* (2013.01); *H03M 1/1009* (2013.01);
(Continued)

(58) Field of Classification Search
CPC ...... H03M 1/16; H03M 1/1245; H03M 1/361; H03M 1/46; H03M 1/462; H03M 1/466;
(Continued)

(56) References Cited

U.S. PATENT DOCUMENTS 5,771,012 A    6/1998 Shu et al.
6,577,185 B1*   6/2003 Chandler .............. H03F 1/0277
                                                  330/133
(Continued)

OTHER PUBLICATIONS

Massimo B. et. al., "A 5GS/s 150mW 10b SHA-Less Pipelined/SAR Hybrid ADC in 28nm CMOS," ISSCC 2015, Session 26 Nyquist-Rate Converters, 26.6, Feb. 25, 2015, 3 pages.

*Primary Examiner* — Khai M Nguyen
(74) *Attorney, Agent, or Firm* — Slater Matsil, LLP

(57) ABSTRACT

An embodiment circuit includes a first reference source configured to provide a first reference signal to an analog-to-digital convertor (ADC). The circuit also includes a filter coupled to an output of the first reference source and configured to filter the first reference signal to produce a filtered first reference signal. The circuit further includes a second reference source coupled to an output of the filter. The second reference source is configured to provide a second reference signal to the ADC, and the second reference signal is generated based on the filtered first reference signal.

19 Claims, 5 Drawing Sheets

Related U.S. Application Data continuation of application No. 15/856,663, filed on Dec. 28, 2017, now Pat. No. 10,027,343, which is a continuation of application No. 15/631,330, filed on Jun. 23, 2017, now Pat. No. 9,866,233, which is a continuation of application No. 15/380,246, filed on Dec. 15, 2016, now Pat. No. 9,705,520.

(51) Int. Cl.
*H03M 1/12* (2006.01)
*H03M 1/10* (2006.01)
*H03M 1/08* (2006.01)
*H03M 1/16* (2006.01)
*H03M 1/44* (2006.01)

(52) U.S. Cl.
CPC ......... *H03M 1/124* (2013.01); *H03M 1/1245* (2013.01); *H03M 1/164* (2013.01); *H03M 1/38* (2013.01); *H03M 1/44* (2013.01)

(58) Field of Classification Search
CPC .. H03M 1/468; H03M 1/1014; H03M 1/1009; H03M 1/38; H03M 1/804
USPC ................................ 341/158, 144, 150, 172
See application file for complete search history.

(56) References Cited

U.S. PATENT DOCUMENTS

| | | |
|---|---|---|
| 6,839,016 B2 | 1/2005 | Roza |
| 7,205,921 B1 | 4/2007 | Savla |
| 7,382,307 B2 | 6/2008 | Dura et al. |
| 7,382,308 B1 | 6/2008 | Liang et al. |
| 8,344,927 B2 * | 1/2013 | Jeon .................... H03M 1/1019 327/307 |
| 8,362,938 B2 | 1/2013 | Cho et al. |
| 8,614,638 B1 | 12/2013 | Limotyrakis et al. |
| 8,760,336 B2 | 6/2014 | Nam |
| 9,030,344 B2 | 5/2015 | Chen et al. |
| 9,059,730 B2 | 6/2015 | Park et al. |

* cited by examiner

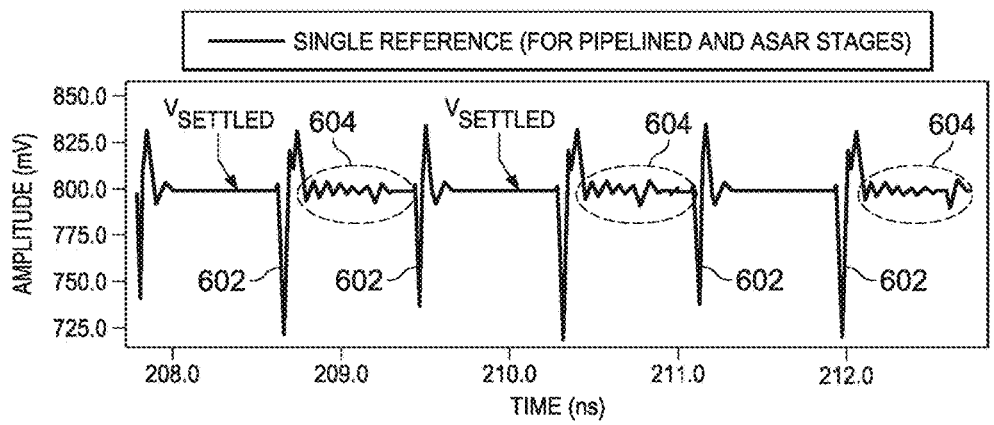
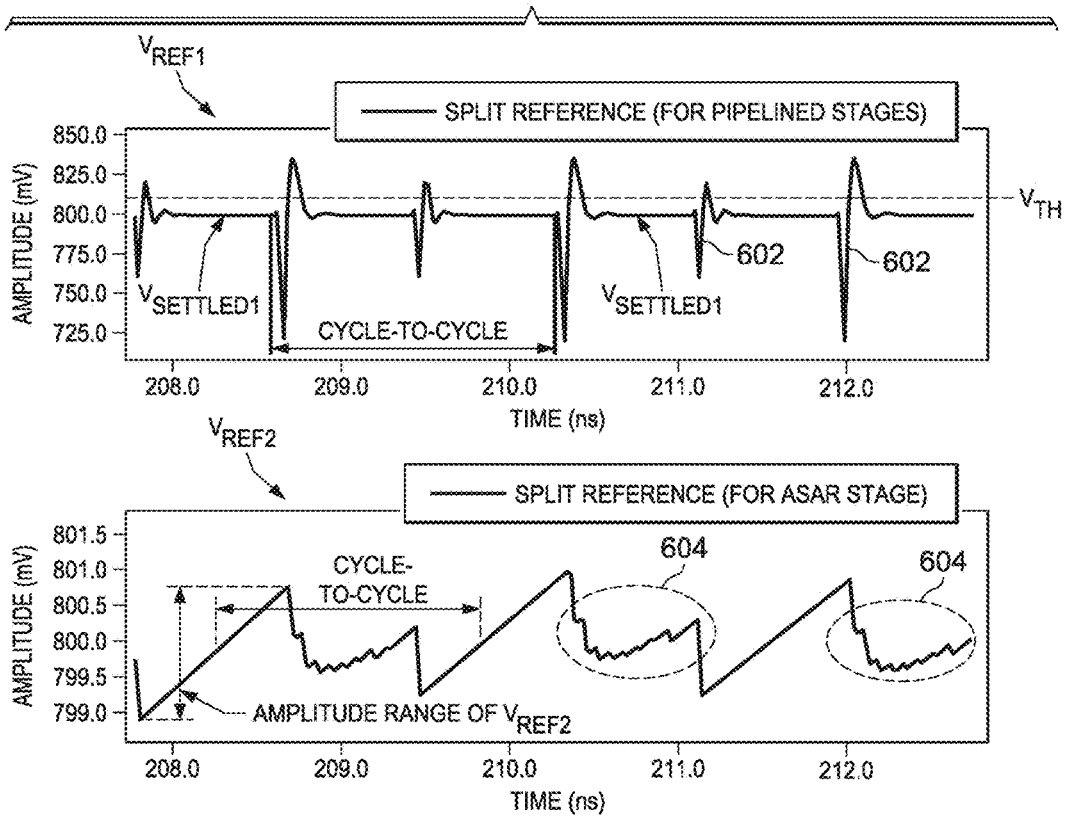

CIRCUIT AND METHOD FOR GENERATING REFERENCE SIGNALS FOR HYBRID ANALOG-TO-DIGITAL CONVERTORS

CROSS-REFERENCE TO RELATED APPLICATIONS

This application is a continuation of U.S. patent application Ser. No. 16/031,753, filed Jul. 10, 2018, which application is a continuation of U.S. patent application Ser. No. 15/856,663 (now U.S. Pat. No. 10,027,343), filed on Dec. 28, 2017, which application is a continuation of U.S. patent application Ser. No. 15/631,330 (now U.S. Pat. No. 9,866,233), filed on Jun. 23, 2017, which application is a continuation of U.S. patent application Ser. No. 15/380,246 (now U.S. Pat. No. 9,705,520), filed on Dec. 15, 2016, and entitled "Circuit and Method for Generating Reference Signals for Hybrid Analog-to-Digital Convertors," which application claims the benefit of Indian Patent Application 201611030760, which was filed on Sep. 8, 2016, which applications are hereby incorporated herein by reference.

TECHNICAL FIELD

The present disclosure relates generally to sampling systems and methods, and, in particular embodiments, to a hybrid analog-to-digital convertor.

BACKGROUND

An analog-to-digital converter (ADC) includes an electronic device that receives an analog signal. As an example, the analog signal may be in the form of a radio-frequency wave, a sound wave, a voltage signal. The ADC samples the received analog signal and outputs a digital representation of the received analog signal. The digital representation may be generated by one or more operations, each of which produces an output represented by a number of bits.

Determination of the bit values of the digital representation may include a comparison of the received analog signal against a reference signal provided to the ADC. As such, accurate reference signals may be needed for optimal ADC operation.

SUMMARY

In an embodiment, a circuit includes a first reference source configured to provide a first reference signal to an analog-to-digital convertor (ADC). The circuit also includes a filter coupled to an output of the first reference source and configured to filter the first reference signal to produce a filtered first reference signal. The circuit further includes a second reference source coupled to an output of the filter. The second reference source is configured to provide a second reference signal to the ADC, and the second reference signal is generated based on the filtered first reference signal.

In an embodiment, a method includes generating a first reference signal for a first stage of a hybrid analog-to-digital convertor (ADC) and filtering the first reference signal to produce a filtered first reference signal. The method further includes generating a second reference signal for a second stage of the hybrid ADC based on the filtered first reference signal.

In an embodiment, a circuit includes a hybrid analog-to-digital convertor (ADC) including a first ADC architecture coupled to a second ADC architecture different from the first ADC architecture. The first ADC architecture may be configured to receive an analog signal. The circuit may further include a first reference driver configured to provide a first reference signal to the first ADC architecture. The first reference signal may determine a first plurality of bits of a digital representation of the analog signal. The circuit further includes a low-pass filter coupled to an output of the first reference driver. The low-pass filter may be configured to filter the first reference signal to produce a filtered first reference signal. The circuit further includes a second reference driver configured to generate a second reference signal based on the filtered first reference signal, and to provide the second reference signal to the second ADC architecture. The second reference signal may determine a second plurality of bits of the digital representation of the analog signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 shows an example of time-domain representation of reference signal that is provided by a reference source to the first stage and the second stage of the hybrid ADC shown in FIG. 1;

FIG. 8 shows a first reference signal and a second reference signal generated by the reference source circuit in FIG. 7, and which are respectively provided to the first stage and the second stage of the hybrid ADC shown in FIG. 1, in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

An analog-to-digital converter (ADC) includes an electronic device that receives an analog signal. The ADC samples the received analog signal and outputs a digital representation of the received analog signal. The digital representation may be generated by one or more operations, each of which produces an output represented by a number of bits.

ADCs may have a hybrid architecture, which may be a combination of two or more stages, each of which has a conventional ADC architecture such as pipeline, flash, successive-approximation register (SAR), asynchronous SAR (ASAR), or sigma-delta (ΣΔ) architectures. Hybrid ADCs, like other ADCs, sample the received analog signal and outputs a digital representation of the received analog signal. Determination of the bit values of the digital representation may include a comparison of an analog signal received by each stage of the hybrid ADC against a reference signal provided to hybrid ADC stage. Reference signals provided to one stage of the hybrid ADC may suffer from interference caused by other stages of the hybrid ADC. Such interference may degrade a performance (e.g. power, area, frequency response) of the hybrid ADC. As such, accurate reference signals may be needed for each of the different stages of the hybrid ADC.

Circuits and methods of providing reference signals to the different stages of a hybrid ADC are provided in accordance with various embodiments. Some embodiments may achieve advantages. Embodiments provide a circuit and a method that use different reference sources, integrated on the same circuit, to provide different reference signals required by the different stages of a hybrid ADC. In some embodiments, interference, caused by one stage, to the reference signal provided to another stage is eliminated or substantially reduced. Furthermore, reference sources having different bandwidths can be designed independently to provide the different reference signals required by the different stages of a hybrid ADC. Embodiments eliminate, or substantially reduce, the need to have an external supply for a reference signal for different stages. Embodiments also eliminate, or substantially reduce, the need for any calibration requirement for reference gain mismatch spurs between the different stages of a hybrid ADC. Embodiments further provide a low power and low area solution that provides the reference signals needed by the different stages of a hybrid ADC.

Figure 1:
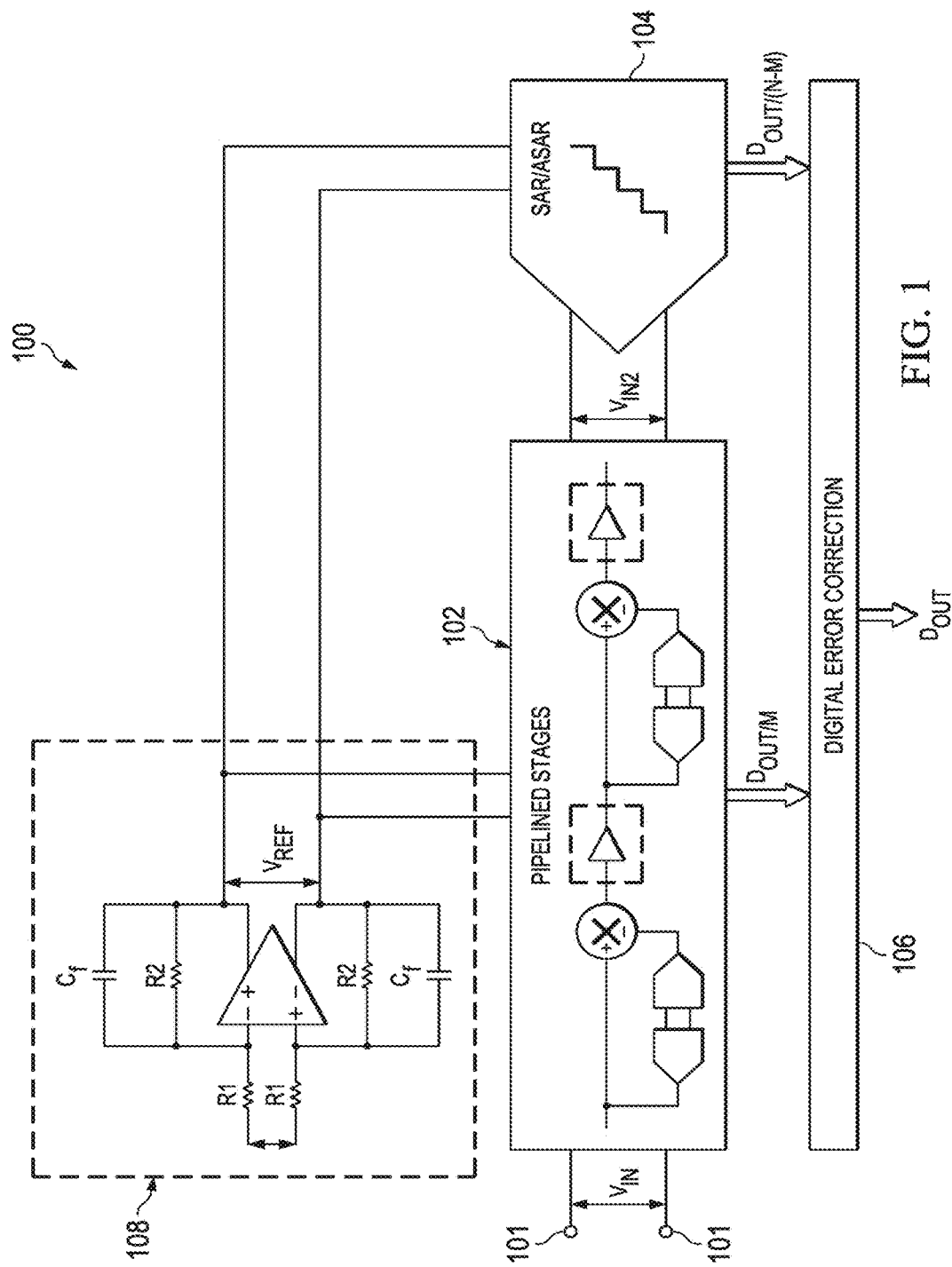
FIG. 1 shows a circuit diagram of a hybrid analog-to-digital convertor (ADC) including a first stage and a second stage, which have different ADC architectures.

FIG. 1 shows a circuit diagram of a hybrid ADC 100 including a first stage 102 and a second stage 104, which have different ADC architectures. Hybrid ADC 100 receives an incoming analog signal $V_{IN}$ and outputs a digital representation $D_{OUT}$ of analog signal $V_{IN}$. In particular, analog signal $V_{IN}$ is received at an input 101 of hybrid ADC 100 and is processed by first stage 102 to determine the most significant bits (MSBs) of digital representation $D_{OUT}$, while second stage 104 may be configured to determine the least significant bits (LSBs) of digital representation $D_{OUT}$. In general, as depicted in FIG. 1, when digital representation $D_{OUT}$ is an N-bit representation of analog signal $V_{IN}$, first stage 102 may be configured to determine the M MSBs of digital representation $D_{OUT}$ (represented in FIG. 1 as $D_{OUT/M}$), while second stage 104 may be configured to determine the (N–M) LSBs of digital representation $D_{OUT}$ (represented in FIG. 1 as $D_{OUT}/(N-M)$). As an example, in a case where digital representation $D_{OUT}$ is a 12-bit representation of analog signal $V_{IN}$, first stage 102 may be configured to determine the 6 MSBs of digital representation $D_{OUT}$, and second stage 104 may be configured to determine the 6 LSBs of digital representation $D_{OUT}$.

Figure 2:
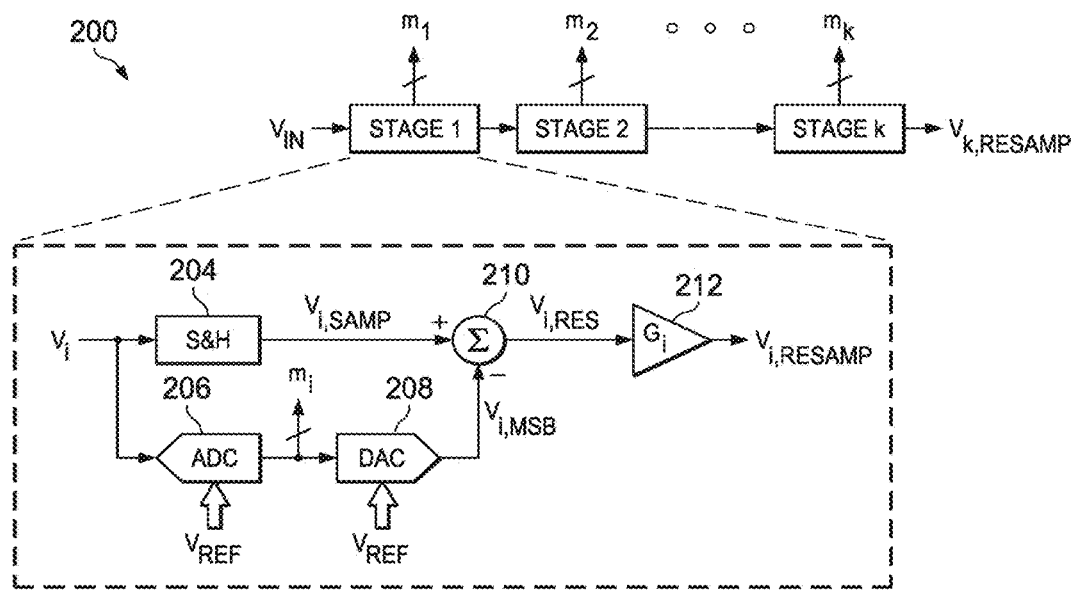
FIG. 2 shows a block diagram of the first stage of the hybrid ADC shown in FIG. 1, in which the first stage has a pipelined ADC architecture.

FIG. 2 shows a block diagram of the first stage 102 of hybrid ADC 100, in which the first stage 102 has a pipelined ADC architecture 200, in accordance with an example. Pipelined ADC architecture 200 may include a plurality of cascaded stages, each of which determines some of the M MSBs of digital representation $D_{OUT}$. As an example, pipelined ADC architecture 200 may include k stages, which are indicated in FIG. 2 as stage 1, stage 2, and so on, until stage k. Each stage i of pipelined ADC architecture 200 (where i=1, 2, . . . , k) may respectively determine $m_i$ bits of the M MSBs of digital representation $D_{OUT}$. As such, in some examples, the sum of $m_1$, $m_2$, . . . , and $m_k$ may be equal to M.

FIG. 2 also shows a block diagram of a single stage of pipelined ADC architecture 200. Each stage i (e.g. where i=1, 2, . . . , k) of pipelined ADC architecture 200 may include a sample-and-hold circuit 204, an ADC element 206, a digital-to-analog convertor (DAC) element 208, a subtracting block 210, and an amplifier 212. Each stage i may also be known as a multiplying-DAC (MDAC). As shown in FIG. 2, each stage i receives input analog signal $V_i$, which is sampled and held by sample-and-hold circuit 204 to produce a sampled analog signal $V_{i,SAMP}$. In the example of stage 1, input analog signal $V_i$ may be the received analog signal $V_{IN}$. The sample-and-hold operation may ensure that successive components of hybrid ADC 100 act on the same portion of analog signal $V_{IN}$. Input analog signal $V_i$ is also provided as an input to ADC element 206, which may determine $m_i$ of the M MSBs of digital representation $D_{OUT}$. For example, ADC element 206 of stage 1 of pipelined ADC architecture 200 may determine the first three MSBs of digital representation $D_{OUT}$. Other numbers of MSBs may be determined by ADC element 206. For example, one, two or four MSBs of digital representation $D_{OUT}$ may be determined by ADC element 206. The $m_i$-bit output of ADC element 206 is subsequently provided as an input to an $m_i$-bit DAC element 208, which produces analog output $V_{i,MSB}$. Analog output $V_{i,MSB}$ of DAC element 208 is subtracted from sampled analog signal $V_{i,SAMP}$ to produce a residue voltage $V_{i,RES}$, which is, in essence, the quantization error of stage i of pipelined ADC architecture 200. The residue voltage $V_{i,RES}$ is amplified by a factor $G_i$ and fed to the next stage (i+1) as amplified residue voltage $V_{i,RESAMP}$. Amplified residue voltage $V_{i,RESAMP}$ of stage i subsequently serves as input analog signal $V_{i+1}$ for stage (i+1) of pipelined ADC architecture 200. This process continues through the pipeline of stages, providing $m_i$ bits per stage, until the M MSBs of digital representation $D_{OUT}$ are determined.

Since the bits from each stage i are determined at different points in time, the bits corresponding to the same sample are time-aligned with shift registers before being fed to the digital-error-correction logic 106 (e.g. shown in FIG. 1). It is noted that when stage i finishes sampling analog signal $V_i$, determining the $m_i$ bits, and passing amplified residue voltage $V_{i,RESAMP}$ to the next stage (i+1), stage i can then start processing the next sample of analog signal $V_{IN}$. As a result of this pipelining action, pipelined ADC architecture 200 may have a high throughput.

ADC element 206 may be a low-resolution sub-ADC and may include converters such as flash ADCs, SAR ADCs, sigma-delta ADCs, dual-slope ADCs, the like, or combinations thereof. Further, ADC element 206 may be implemented using various fabrication techniques such as complementary metal-oxide semiconductor (CMOS), bipolar silicon technologies, or III-V type fabrication.

In some systems, the effective number of bits $m_i$ determined by ADC element 206 of stage i of pipelined ADC architecture 200 may not be an integer. For example, ADC element 206 may produce ($n_i$−0.5) effective bits, and the $m_i$ bits of the M MSBs of digital representation $D_{OUT}$ may be a floor of the value ($n_i$−0.5). In an exemplary system, portions of bits (e.g. a half-bit) are used in error correction or mitigation schemes. Thus, the integer bits (e.g. whole-bits) may be applied to measurement of the signal and the remaining portion of a bit (e.g. a half-bit) may be used to remove artifacts from the integer measurement bits. Alternatively or additionally, the portion of a bit (e.g. a half-bit) may be used to reference the integer bit to another parallel or series bit determination. Whole or integer bits may also be applied to such error correction schemes. Bits applied to error correction rather than to measurement may not be counted as significant bits. For example, if stage i determines 2.5 effective bits and applies 0.5 effective bits to error correction, then stage i determines two MSBs of digital representation $D_{out}$.

As shown in FIG. 2, ADC element 206 and DAC element 208 may be supplied with a reference signal $V_{REF}$. Referring to FIG. 1, reference signal $V_{REF}$ may be provided by reference source 108. In the example of FIG. 1, reference source 108 is depicted as a differential amplifier (e.g. a fully differential amplifier). In other examples, however, reference source 108 may be any sort of amplifier or driver and may include one or more amplifier or driver stages. In FIG. 1, reference source 108 provides reference signal $V_{REF}$ to both first stage 102 and second stage 104. Reference signal $V_{REF}$ may be used by the ADC element 206 to determine appropriate bit levels and by DAC element 208 to determine the analog signal equivalent to the bits generated by ADC element 206. The scale of measurement may be determined based on reference signal $V_{REF}$. Furthermore, reference signal $V_{REF}$ may affect power consumption of overall ADC (e.g. hybrid ADC 100) and selection of reference signal $V_{REF}$ may increase or decrease the power consumption of overall ADC. The effect of reference signal $V_{REF}$ on power consumption of ADC element 206 may be determined, at least in part, by the type and parameters of ADC element 206. Some systems may have constraints on what constitutes an acceptable reference signal level depending on the architecture and power supply voltages of ADC element 206. As such, the range of acceptable reference signals $V_{REF}$ may vary with ADC element 206 type (e.g. flash ADCs, SAR ADCs, sigma-delta ADCs, dual-slope ADCs, or the like).

The output of ADC element 206 may be passed to DAC element 208 for reconstruction of analog output $V_{i,MSB}$. DAC element 208 may include various DAC types, such as, binary-weighted DACs, R-2R ladder DACs, oversampling DACs, pulse-width modulators, thermometers-coded DACs, hybrid DACs, the like, or combinations thereof. Analog output $V_{i,MSB}$ is provided to an input of subtracting block 210. Another input of subtracting block 210 is provided with sampled analog signal $V_{i,SAMP}$. Subtracting block 210 in configured to subtract analog output $V_{i,MSB}$ from sampled analog signal $V_{i,SAMP}$ to yield an unmeasured portion $V_{i,RES}$ of sampled analog signal $V_{i,SAMP}$. As mentioned above, the unmeasured portion $V_{i,RES}$ (referred to as residual signal $V_{i,RES}$) may represent the quantization error of stage i of pipelined ADC architecture 200.

Residual signal $V_{i,RES}$ may be passed through amplifier 212 to produce amplified residue voltage $V_{i,RESAMP}$. The gain $G_i$ of amplifier 212 may depend, at least in part, on the number of MSBs $m_i$ generated by the respective stage i. For example, if $m_i$ MSBs are generated by stage i of pipelined ADC architecture 200, amplifier may amplify residual signal $V_{i,RES}$ by a factor of $2^{m_i}$. Such a gain $G_i$ may result in a signal level of amplified residue voltage $V_{i,RESAMP}$ being similar to that of analog signal $V_{IN}$, which may assist in ensuring that the signal being measured by the stages of pipelined ADC architecture 200 is within the effective measurement range of components of each stage i of pipelined ADC architecture 200. Furthermore, the gain $G_i$ allows amplified residue voltage $V_{i,RESAMP}$ to have a large signal amplitude, and since amplified residue voltage $V_{i,RESAMP}$ serves as input analog signal $V_{i+1}$ for stage (i+1) of pipelined ADC architecture 200, the gain $G_i$ relaxes the resolution requirement of ADC element 206 of stage (i+1).

Figure 3:
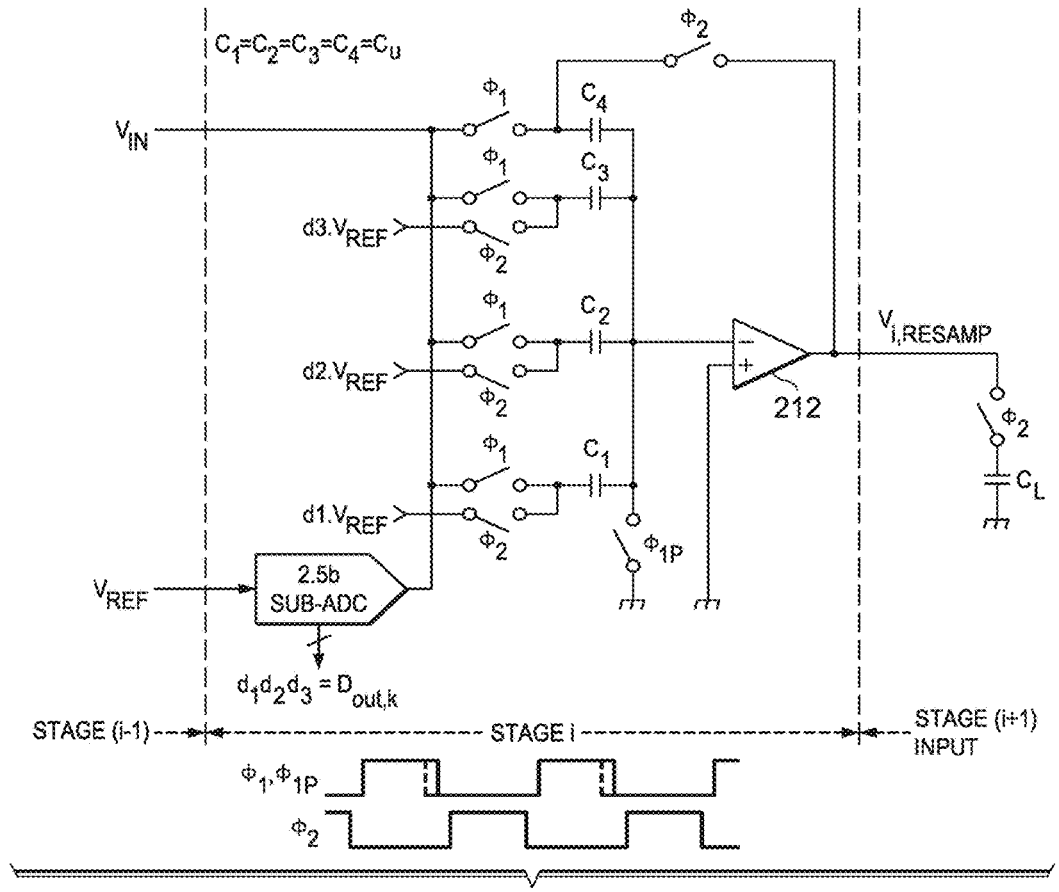
FIG. 3 shows a single-ended circuit implementation of a 2.5-bit multiplying digital-to-analog convertor.

FIG. 3 shows a single-ended circuit implementation 300 of a 2.5-bit MDAC, in accordance with an example. The implementation in FIG. 3 may, as an example, be used in each of the k stages of pipelined ADC architecture 200. In the example of FIG. 3, each stage i (e.g. where i=1, 2, . . . , k) may output 2.5 bits. Furthermore, in the example of FIG. 3, the block labelled "2.5b sub-ADC" may be identified with ADC element 206 shown in FIG. 2, while capacitors C1, C2, C3, and C4 and switches Φ1, Φ1P, and Φ2 may implement DAC element 208 and subtracting block 210 shown in FIG. 2. As shown in FIG. 3, analog signal $V_{IN}$ is sampled onto capacitors C1, C2, C3, and C4 (e.g. when switches Φ1 and ΦP are closed and when switches Φ2 are open). Following this, charges stored in capacitors C1, C2, and C3 are transferred to capacitor C4 (e.g. when switches Φ1 are closed and when switches DIP and Φ2 are open), thereby amplifying the input signal by a factor of 4. The bottom plates of capacitors C1, C2, and C3 are connected to the output of ADC element 206 (e.g. when switches DP are closed and when switches Φ1 and Φ2 are open) to implement the DAC subtraction. Amplifier 212 shown in FIG. 3 also amplifies the voltage at its input to produce amplified residue voltage $V_{i,RESAMP}$ that is provided to the next stage (i+1) of pipelined ADC architecture 200.

Since each sample of analog signal $V_{IN}$ propagates through the entire pipeline of stages of pipelined ADC architecture 200 before the associated M MSBs of digital representation $D_{OUT}$ are available for combining in digital-error-correction logic 106, pipelined ADC architecture 200 may suffer from data latency. In some examples, the data latency may proportional to the number of stages k in pipelined ADC architecture 200. The last stage (e.g. stage k shown in FIG. 2) of pipelined ADC architecture 200 outputs amplified residue voltage $V_{k,RESAMP}$, which serves as input analog signal $V_{IN2}$ for the second stage 104 of hybrid ADC 100 (e.g. as shown in FIG. 1). In some examples, second stage 104 may have a SAR ADC architecture or an ASAR ADC architecture.

Figure 4:
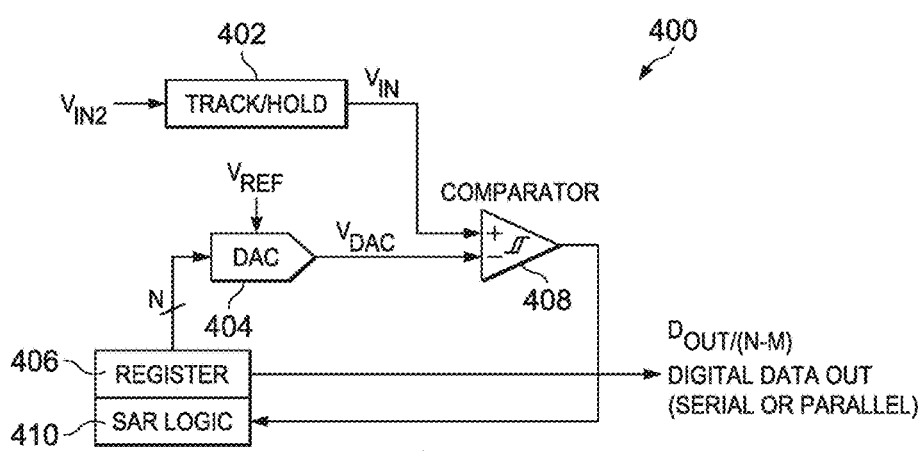
FIG. 4 shows a block diagram of the second stage of the hybrid ADC shown in FIG. 1, in which the second stage has a successive-approximation register ADC architecture.

FIG. 4 shows a block diagram of the second stage 104 of hybrid ADC 100, in which the second stage 104 has a simplified SAR ADC architecture 400, in accordance with an example. In some other examples, second stage 104 may have an asynchronous SAR (ASAR) ADC architecture. The SAR ADC architecture 400 implements a binary search algorithm, and a single comparator (e.g. comparator 408 shown in FIG. 4) is used in a serial fashion to resolve the input. Reference signal $V_{REF}$ may be used by SAR ADC architecture 400 for the binary search algorithm. Therefore, while the internal circuitry may be running at several megahertz (MHz), the ADC sample rate is a fraction of that number due to the successive-approximation algorithm. Although there may be many variations for implementing a SAR ADC, a basic architecture is as shown in FIG. 4. It is noted that the basic architecture of the various implementations of a SAR ADC has low analog complexity and low power consumption (e.g. zero direct current (DC) power)

because a single comparator is used to perform the successive-approximation algorithm, which, as mentioned above, is essentially a binary search algorithm.

As shown in FIG. 4, input analog signal $V_{IN2}$ (e.g. provided by the last stage of first stage 102 may be provided to a track and hold circuit 402, which may be a sample-and-hold circuit. As described above in relation to FIG. 1, second stage 104 may determine the (N−M) LSBs of digital representation $D_{OUT}$. As such, SAR ADC architecture 400 may include an (N−M)-bit DAC 404 and an (N−M)-bit register 406. As shown in FIG. 4, reference signal $V_{REF}$ may be provided (e.g. by reference source 108) to DAC 404. To implement the binary search algorithm, (N−M)-bit register 406 is set to midscale (e.g., 100 . . . 00, where the MSB of $D_{OUT/(N-M)}$ is set to i). This may force an output voltage $V_{DAC}$ of DAC 404 to be $V_{REF}/2$. A comparison is then performed to determine if input analog signal $V_{IN2}$ is less than, or greater than, $V_{DAC}$. As such, SAR ADC architecture 400 may further include comparator 408. If input analog signal $V_{IN2}$ is greater than $V_{DAC}$, an output of comparator 408 may be set to logic HIGH, and the MSB of (N−M)-bit register 406 remains at binary value 1. Conversely, if input analog signal $V_{IN2}$ is less than $V_{DAC}$, the output of comparator 408 may be set to logic LOW (e.g. binary value 0) and the MSB of (N−M)-bit register 406 is cleared to binary value 0. SAR control logic 410 of SAR ADC architecture 400 then moves to the next bit in the (N−M)-bit sequence, forces that bit to logic HIGH, and does another comparison. The sequence continues all the way down to the LSB of (N−M)-bit register 406. Once this is done, the conversion is complete and the (N−M) LSBs of digital representation $D_{OUT}$ is available in register 406. It is noted that (N−M) comparison periods are required for a (N−M)-bit SAR ADC. Consequently, SAR ADC architecture 400 may not be ready for the next determination of the (N−M) LSBs of digital representation $D_{OUT}$ until the current determination of the (N−M) LSBs of digital representation $D_{OUT}$ is complete.

Figure 5:
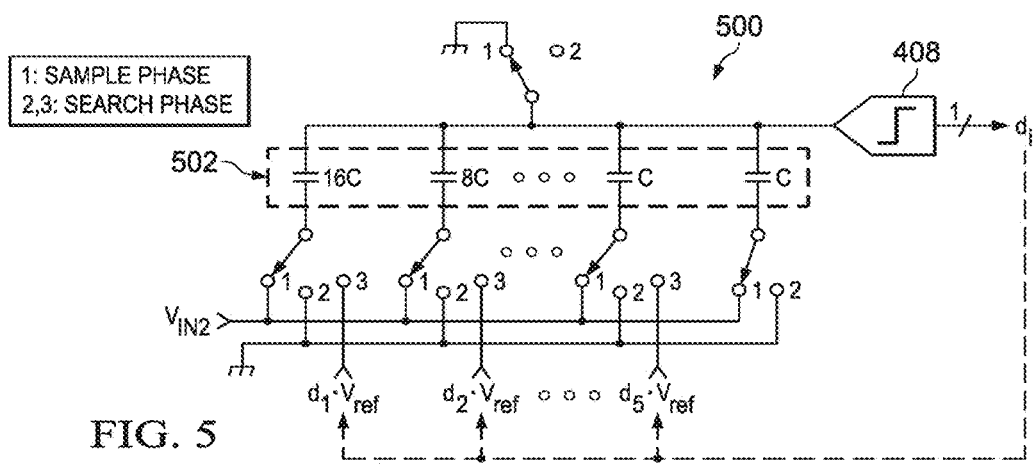
FIG. 5 shows a 5-bit successive-approximation register ADC.

FIG. 5 shows a 5-bit SAR ADC 500, in accordance with an example. Simplified SAR ADC architecture 400 may have the architecture shown in FIG. 5, in an example where second stage 104 determines 6 LSBs of digital representation $D_{OUT}$. Based on the description given above in respect of FIG. 4, simplified SAR ADC architecture 400 has a sample phase in which input analog signal $V_{IN2}$ is sampled and a search phase in which the binary search algorithm is performed. In the context of FIG. 5, in the sample phase, input analog signal $V_{IN}$m is sampled onto the bottom plates of each capacitor of capacitor array 502 (e.g. when switches of capacitor array 502 are in position 1 indicated in FIG. 5). In this sample phase, the top plate of each capacitor of capacitor array 502 is connected to a fixed potential (e.g. ground), as shown in FIG. 5.

The search phase then proceeds by switching the bottom plate of each binary weighted capacitor to either $V_{REF}$ or $-V_{REF}$, such that top plate voltage eventually goes to zero. For example, the MSB of $D_{OUT/(N-M)}$ (denoted as d1 in FIG. 5) is assigned the value +1 if the sign of the top plate potential at the start of the search phase (e.g. the sign of $-V_{IN2}$) is negative. On the other hand, the MSB of $D_{OUT/(N-M)}$ (denoted as d1 in FIG. 5) is assigned the value −1 if the sign of the top plate potential at the start of the search phase (e.g. the sign of $-V_{IN2}$) is positive. Following this determination, the bottom plate of the capacitor corresponding to the MSB of $D_{OUT/(N-M)}$ (denoted as capacitor with capacitance 16C) is connected to d1.$V_{REF}$, which as described above, has a value 0f either $V_{REF}$ or $-V_{REF}$. In so doing, the voltage of the top plate of the capacitor corresponding to the MSB of $D_{OUT/(N-M)}$ either shifts up by $V_{REF}/2$ (e.g. when bottom plate of the capacitor has voltage $V_{REF}$) or shifts down by $V_{REF}/2$ (e.g. when bottom plate of the capacitor has voltage $-V_{REF}$). Subsequently, the other bits $d_j$ (where j=2 to 6) are decided and their corresponding capacitor bottom plate switched. Thus, the top plate potential progressively approaches zero, and the determination ends when the LSB of $D_{OUT/(N-M)}$ (e.g. $d_6$, in the example of FIG. 5) is decided.

In light of the description above, hybrid ADC 100 having one or more pipelined stages (e.g. in first stage 102) followed by a SAR or ASAR stage (e.g. in second stage 104) may take advantage of high throughput of pipelined stages and zero DC power advantage of SAR ADC. However, in SAR ADC architecture 400 (and in the example of the 5-bit SAR ADC 500 in FIG. 5), the bits are decided by a single high-speed, high-accuracy comparator 408 bit-by-bit, from the MSB of $D_{OUT/(N-M)}$ down to the LSB of $D_{OUT/(N-M)}$. Although there is only one comparator 408, it is preferable that this component be fast, and typically, comparator 408 is clocked at approximately (N−M) times the sampling rate of hybrid ADC 100. Consequently, if first stage 102 of hybrid ADC 100 (e.g. including pipelined ADC architecture 200) is being clocked at a sampling frequency $F_S$, then second stage 104 (e.g. including SAR ADC architecture 400 that resolves (N−M) bits of $D_{OUT}$) may be clocked at a frequency (N−M)$F_S$. As such, design of reference source 108 may become difficult to accommodate high frequency switching transients of SAR ADC architecture 400.

FIG. 6 shows an example time-domain representation 600 of reference signal $V_{REF}$ that is provided by reference source 108 to first stage 102 and second stage 104 of hybrid ADC 100 shown in FIG. 1. The horizontal axis of the time-domain signal 600 shown in FIG. 6 represents a linear scale of time (e.g. expressed in nanoseconds), while the vertical axis represents a linear scale of amplitude (e.g. expressed in millivolts (mV)). As shown in FIG. 6, reference signal $V_{REF}$ may have a settled value (indicated in FIG. 6 as $V_{SETTLED}$). In the example of FIG. 6, the settled value $V_{SETTLED}$ of reference signal $V_{REF}$ may be about 800 mV. However, reference signal $V_{REF}$ suffers from large transient spikes 602 that occur periodically, and these transients can be attributed to capacitor switching in first stage 102 (e.g. during sampling, digital-to-analog conversion, and subtraction operations performed by each stage i of pipelined ADC architecture 200). As described above, capacitor switching in first stage 102 may occur at the sampling frequency $F_S$. Also shown in FIG. 6, reference signal $V_{REF}$ also suffers from transient interference 604 that occurs between some of the large transient spikes 602. The transient interference 604 can be attributed to capacitor switching in the second stage 104 (e.g. during sampling and binary search algorithm of SAR ADC architecture 400). As described above, capacitor switching in second stage 104 may occur at a frequency of (N−M)*$F_S$.

As described above in relation to FIGS. 2 to 5, reference signal VP may be used by ADC elements 206 and DAC element 208 of first stage 102 (e.g. pipelined ADC architecture 200) to determine appropriate bit levels and its equivalent analog value. Reference signal $V_{REF}$ may also be used by second stage 104 (e.g. SAR ADC architecture 400) for the binary search algorithm. As such, the quality of reference signal $V_{REF}$ can affect the bit levels determined by ADC elements 206 and residue signal generated by DAC element 208 of the first stage 102 and the binary search algorithm performed by the second stage 104. However, the large transient spikes 602 and the transient interference 604 occurring in reference signal $V_{REF}$ may affect the accuracy of reference signal $V_{REF}$ provided to both the first stage 102 and the second stage 104 of hybrid ADC 100. For example, the large transient spikes 602 of reference signal $V_{REF}$ may detrimentally affect the binary search algorithm performed by the second stage 104 (e.g. SAR ADC architecture 400). Additionally, the transient interference 604 may detrimentally affect bit levels determined by ADC elements 206 and residue signal generated by DAC element 208 of the first stage 102 (e.g. pipelined ADC architecture 200).

One way to provide an accurate reference signal $V_{REF}$ may be to supply the charge required for the switching of the first stage 102 (e.g. that occurs at a frequency of $F_S$) and second stage 104 (e.g. that can occur at a frequency of $(N-M)*F_S$) using a large decoupling capacitor that is connected between an output of reference source 108 and supply voltage (e.g. ground supply). Another way to provide an accurate reference signal $V_{REF}$ may be to design a sufficiently high-bandwidth reference source 108 to fully settle switching transients at the desired sampling frequency $F_S$ of the first stage 102 as well as switching transients of second stage 104 which can occur at a frequency of $(N-M)*F_S$. However each of these options involves a trade-off between area and power. For example, using a large decoupling capacitor may involve large area. Furthermore, designing a sufficiently high-bandwidth reference source 108 to fully settle switching transients at the desired sampling frequency $F_S$ of the first stage 102 may not be sufficient to settle the $(N-M)*F_S$ switching transients 604 for full accuracy of the overall hybrid ADC 100. A high bandwidth reference source 108 for first stage 102 (e.g. pipelined ADC architecture 200) may be designed and used in combination with an external reference source that is used to provide the reference signal for the second stage 104 (e.g. SAR ADC architecture 400). However, such a method may involve increased area and may also lead to greater power consumption and digital calibration of mismatch spurs produced due to the difference in both references.

As such, there may be a need for a circuit and a method that uses different reference sources, integrated on the same circuit, to provide different reference signals required by the different stages 102 and 104 of hybrid ADC 100. There may also be a need to eliminate, or substantially reduce, interference, caused by one stage (e.g. 102 or 104, respectively), to the reference signal provided to another stage (e.g. 104 or 102, respectively). Furthermore, there may be a need for reference sources having different bandwidths that can be designed independently to provide the different reference signals required by the different stages 102 and 104 of hybrid ADC 100. There may also be a need to eliminate, or substantially reduce, the need to have an external supply for a reference signal for different stages. There may additionally be the need to eliminate, or substantially reduce, a calibration requirement for reference gain mismatch spurs between the different stages of a hybrid ADC. A low power and low area solution that provides the reference signals needed by the different stages 102 and 104 of hybrid ADC 100 may also be needed.

Figure 7:
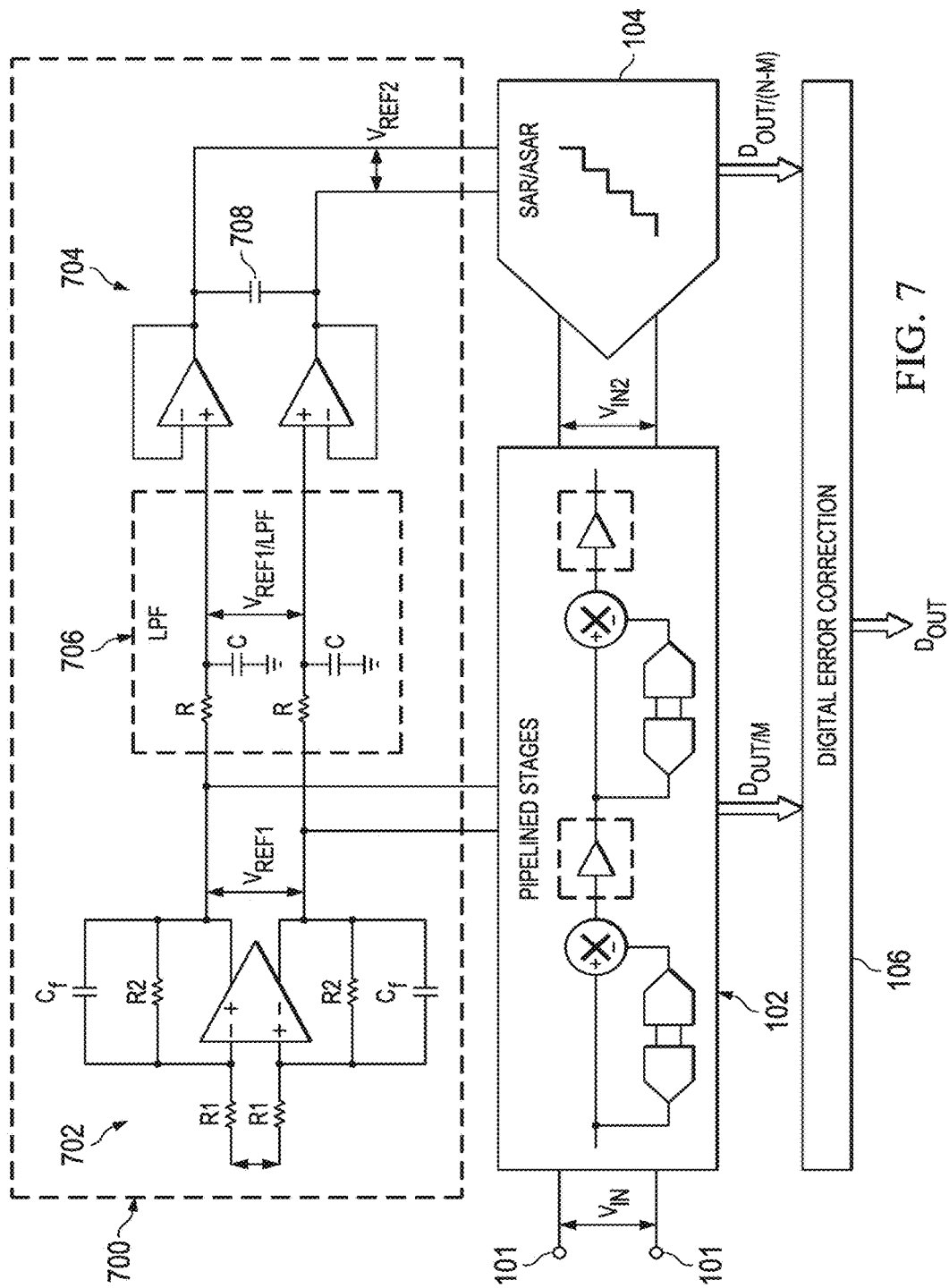
FIG. 7 shows a reference source circuit including a first reference source, a second reference source, and a filter connected between an output of the first reference source and an input of the second reference source, in accordance with an embodiment.

FIG. 7 shows a reference source circuit 700 including first reference source 702, second reference source 704, and filter 706 connected between an output of first reference source 702 and an input of second reference source 704, in accordance with an embodiment. In some embodiments, such as in the example of FIG. 7, filter 706 may include, or may be, a low-pass filter. In the example shown in FIG. 7, first reference source 702 provides first reference signal $V_{REF1}$ to first stage 102 of hybrid ADC 100, while second reference source 704 provides second reference signal $V_{REF2}$ to second stage 104 of hybrid ADC 100. In the example of FIG. 7, first reference source 702 is depicted as a differential amplifier (e.g. a fully differential amplifier). In other examples, however, first reference source 702 may be any sort of amplifier or driver and may include one or more amplifier or driver stages.

As shown in FIG. 7, second reference source 704 generates second reference signal $V_{REF2}$ based on first reference signal $V_{REF1}$. In particular, filter 706 may filter first reference signal $V_{REF1}$ and provide filtered first reference signal $V_{REF1/LPF}$ (e.g. shown in FIG. 7) as an input to second reference source 704. In the example of FIG. 7, second reference source 704 is depicted as a two single ended amplifier (e.g. two voltage followers). In other examples, however, second reference source 704 may be any sort of amplifier or driver and may include one or more amplifier or driver stages single ended or differential. Second reference signal $V_{REF2}$ may be generated based on filtered first reference signal $V_{REF1/LPF}$. As an example, second reference source 704 may amplify filtered first reference signal $V_{REF1/LPF}$ to produce second reference signal $V_{REF2}$, which is subsequently provided to second stage 104 of hybrid ADC 100.

Referring now to filter 706, a cutoff frequency of filter 706 may be determined based on a frequency of large transient spikes 602. For example, suppose the frequency of large transient spikes 602 is denoted as $F_{SPIKE}$, then a cutoff frequency of filter 706 may be between about 5 times and about to times lower than frequency $F_{SPIKE}$. Illustratively, if the frequency $F_{SPIKE}$ is about 600 MHz, then cutoff frequency of filter 706 may be between about 60 MHz and about 120 MHz. In some embodiments, frequency $F_{SPIKE}$ may be determined by direct frequency counting or reciprocal frequency counting. In direct frequency counting, the number of signal cycles of large transient spikes 602 for a known time interval (e.g. 1 second) is counted. If the time interval is equal to one second, the frequency is expressed as (Hz). As an example, a voltage threshold $V_{TH}$ (e.g. indicated in FIG. 8) may be set, and the number of times first reference signal $V_{REF1}$ crosses the voltage threshold $V_{TH}$ may be indicative of the frequency of large transient spikes 602. On the other hand, in reciprocal frequency counting, the period of the large transient spikes 602, which can be determined by measuring the time interval for completion of a single signal cycle, is determined. Once the period of the signal has been determined, the frequency of large transient spikes 602 can be determined by the reciprocal of the period. Reciprocal frequency counting may require the determination of the start of a signal cycle and the start of the next signal cycle, and the time between successive crossings of the voltage threshold VTH may be indicative of the period of large transient spikes 602. These methods are merely examples of determining the frequency of large transient spikes 602, and other methods known in the art may be performed to determine the frequency of large transient spikes 602.

In some embodiments, filter 706 may be implemented by an RC circuit, as in the example of FIG. 7. In such embodiments, it may be preferable to have a large resistance for resistor R so that filter 706 does not load first reference source 702. However, it is noted that filter 706 may be implemented by other methods known in the art, and a resistance of filter 706 may be selected to be sufficiently high to prevent loading of first reference source 702.

In some embodiments, such as in the example of FIG. 7, an optional capacitive element 708 may be coupled at an output of second reference source 704 (e.g. between outputs of two single ended reference drivers of second reference source 704). This capacitive element 708 can be connected between the output of the reference driver/drivers and supply (e.g. ground supply). Normally the value 0f this capacitive element is $2^{N-M}$*total DAC capacitance of SAR (e.g. FIG. 5 showing 5-bit SAR and the value 0f C is 1 fF then this capacitive element 708 will be 26*32 fF). Capacitive element 708 (which may function as a decoupling capacitor or a bypass capacitor) may be chosen to have a capacitance sufficient to provide the electric charge needed for the $(N-M)*F_S$ switching of second stage 104 (e.g. having SAR or ASAR ADC architecture). In some embodiments, capacitive element 708 may be coupled between an output terminal of second reference source 704 and a supply voltage.

Reference source circuit 700 may be referred to as a split reference scheme for hybrid ADC 100, in which different reference drivers (e.g. first and second reference sources 702 and 704) are electrically coupled to each other to provide different reference signals to first stage 102 and second stage 104 of hybrid ADC 100. Furthermore, the operation of the different reference drivers 702, 704 are not independent, since second reference signal $V_{REF2}$ (e.g. provided by second reference source 704 to second stage 104) is generated based on a filtered version (e.g. low-pass filtered version) of first reference signal $V_{REF1}$ (e.g. which is provided by first reference source 702 to first stage 102). As such, different drivers e.g. first and second reference sources 702 and 704) and a filter 706 are arranged in a manner to satisfy specific reference requirements of both first stage 102 (e.g. having pipelined ADC architecture) and second stage 104 (e.g. having SAR or ASAR ADC architecture).

FIG. 8 shows first reference signal $V_{REF1}$ and second reference signal $V_{REF2}$ generated by reference source circuit 700 and which are respectively provided to first stage 102 and second stage 104 of hybrid ADC 100, in accordance with an embodiment. As shown in FIG. 8, first reference signal $V_{REF1}$ provided to first stage 102 (e.g. having pipelined ADC architecture) may be free from transient interference 604 attributed to capacitor switching in the second stage 104, although large transient spikes 602 may still be present. The large transient spikes 602 may still be present because first reference source 702 is still communicatively coupled to first stage 102, and thus capacitor switching in first stage 102 may still cause jitter in first reference signal $V_{REF1}$. However, transient interference 604, produced by capacitor switching in second stage 104, is shunted through capacitive element 708, thereby reducing its effect on first reference signal $V_{REF1}$.

Furthermore, second reference signal $V_{REF2}$ may be free from large transient spikes 602 attributed to capacitor switching in first stage 102, although transient interference 604 may still be present. The transient interference 604 may still be present since second reference source 704 is still communicatively coupled to second stage 104, and thus capacitor switching in second stage 104 may still cause jitter in second reference signal $V_{REFM}E$ but these transients can be suppressed by the capacitive element 708 whose value is not that large as it is providing the charge to the LSB sized capacitor switching. However, large transient spikes 602, produced by capacitor switching in first stage 102, are filtered out by filter 706. Hence, the large transient spikes caused by first stage 102 do not affect the second stage reference and the small transient spikes 604 do not disturb the first stage reference.

As such, the split reference scheme implemented by reference source circuit 700 may eliminate, or substantially reduce, the interference noise created by second stage 104 (e.g. having SAR or ASAR ADC architecture). Furthermore, since first stage 102 (which may include pipelined ADC stages) determines bits $D_{OUT/M}$ prior to second stage 104 determining bits $D_{OUT/(N-M)}$, the matching requirement between first reference signal $V_{REF1}$ and second reference signal $V_{REF2}$ is relaxed. In other words, due to different reference signals being provided to first stage 102 and second stage 104, second reference signal $V_{REF2}$ can have a low bandwidth capacitive driver (e.g. in an embodiment where second reference source 704 is designed as a capacitive driver) and a small decoupling capacitor (e.g. capacitive element 708) can be sufficient to provide charge for $(N-M)*F_S$ switching of second stage 104 (e.g. having SAR or ASAR ADC architecture). At the same time, a high bandwidth reference driver (e.g. first reference source 702) for first stage 102 (e.g. having one or more pipelined ADC stages) can be independently designed to achieve the required settling of the switching of first stage 102 (occurring at sampling frequency $F_S$), without having interference of the $(N-M)*F_S$ switching of second stage 104.

As shown in FIG. 8, first reference signal $V_{REF1}$ may have a settled value $V_{SETTLED1}$, which may be substantially equal to the settled value $V_{SETTLED}$ of reference signal $V_{REF}$ shown in FIG. 6. In some embodiments, the settled value $V_{SETTLED1}$ of first reference signal $V_{REF1}$ may be 12 or more number of bits accurate from the settled value $V_{SETTLED}$ of reference signal $V_{REF}$. In the examples shown in FIG. 8, the settled value $V_{SETTLED}$ of first reference signal $V_{REF1}$ may be about 800 mV (which is substantially equal to the settled value $V_{SETTLED}$ of reference signal $V_{REF}$ shown in FIG. 6). Furthermore, the settled value $V_{SETTLED1}$ of first reference signal $V_{REF1}$ may be the same from cycle to cycle (indicated in FIG. 8 as the Cycle-to-Cycle line).

In a similar manner, second reference signal $V_{REF2}$ may have amplitudes that are substantially equal to the settled value $V_{SETTLED}$ of reference signal $V_{REF}$ shown in FIG. 6. In the examples shown in FIG. 8, the range of amplitudes of second reference signal $V_{REF2}$ may be about 800 mV (e.g. in a range from about 799 mV to about 800.8 mV, which is substantially equal to the settled value $V_{SETTLED}$ of reference signal $V_{REF}$ shown in FIG. 6). In some embodiments, the range of amplitudes of second reference signal $V_{REF2}$ may be more than (N−M)bit accurate from the settled value $V_{SETTLED}$ of reference signal $V_{REF}$. Furthermore, the amplitude of second reference signal $V_{REF2}$ may be substantially equal from cycle to cycle (indicated in FIG. 8 as the Cycle-to-Cycle line).

This, consequently, eliminates, or substantially reduces, the need to have any external supply for a reference signal for second stage 104 (e.g. having SAR or ASAR ADC architecture), and this can eliminate, or substantially reduce, the need for any calibration requirement for reference gain mismatch spurs between first stage 102 (e.g. having one or more pipelined ADC stages) and second stage 104 (e.g. SAR or ASAR ADC). Consequently, reference source circuit 700 shown in FIG. 7 is a low power and low area solution that provides the reference signals needed for hybrid ADC (e.g. high speed hybrid ADC 100).

Circuits and methods of providing reference signals to the different stages of a hybrid ADC are provided in accordance with various embodiments. Some embodiments may achieve advantages. Embodiments provide a circuit and a method that use different reference sources, integrated on the same circuit, to provide different reference signals required by the different stages of a hybrid ADC. In some embodiments, interference, caused by one stage, to the reference signal provided to another stage is eliminated or substantially reduced. Furthermore, reference sources having different bandwidths can be designed independently to provide the different reference signals required by the different stages of a hybrid ADC. Embodiments eliminate, or substantially reduce, the need to have an external supply for a reference signal for different stages. Embodiments also eliminate, or substantially reduce, the need for any calibration requirement for reference gain mismatch spurs between the different stages of a hybrid ADC. Embodiments further provide a low power and low area solution that provides the reference signals needed by the different stages of a hybrid ADC.

In an embodiment, a circuit includes a first reference source configured to provide a first reference signal to an analog-to-digital convertor (ADC). The circuit also includes a filter coupled to an output of the first reference source and configured to filter the first reference signal to produce a filtered first reference signal. The circuit further includes a second reference source coupled to an output of the filter. The second reference source is configured to provide a second reference signal to the ADC, and the second reference signal is generated based on the filtered first reference signal.

In an embodiment, a method includes generating a first reference signal for a first stage of a hybrid analog-to-digital convertor (ADC) and filtering the first reference signal to produce a filtered first reference signal. The method further includes generating a second reference signal for a second stage of the hybrid ADC based on the filtered first reference signal.

In an embodiment, a circuit includes a hybrid analog-to-digital convertor (ADC) including a first ADC architecture coupled to a second ADC architecture different from the first ADC architecture. The first ADC architecture may be configured to receive an analog signal. The circuit may further include a first reference driver configured to provide a first reference signal to the first ADC architecture. The first reference signal may determine a first plurality of bits of a digital representation of the analog signal. The circuit further includes a low-pass filter coupled to an output of the first reference driver. The low-pass filter may be configured to filter the first reference signal to produce a filtered first reference signal. The circuit further includes a second reference driver configured to generate a second reference signal based on the filtered first reference signal, and to provide the second reference signal to the second ADC architecture. The second reference signal may determine a second plurality of bits of the digital representation of the analog signal.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
generating, by a first reference source, a first reference signal for a first stage of a hybrid analog-to-digital convertor (ADC);
filtering, by a filter coupled to an output terminal of the first reference source, the first reference signal to produce a filtered first reference signal, wherein loading of the first reference source by the filter is reduced based on a resistance of the filter;
generating, by a second reference source coupled to an output of the filter, a second reference signal for a second stage of the hybrid ADC downstream from the first stage of the hybrid ADC using the filtered first reference signal; and
providing, by a capacitive element coupled to an output terminal of the second reference source, an electrical charge for capacitive switching of the second stage of the hybrid ADC.

2. The method of claim 1, wherein loading of the first reference source by the filter is reduced by increasing the resistance of the filter.

3. The method of claim 1, wherein the capacitive element is coupled between the output terminal of the second reference source and another output terminal of the second reference source.

4. The method of claim 1, wherein the capacitive element is coupled between the output terminal of the second reference source and a reference potential.

5. The method of claim 1, wherein the first reference signal comprises a transient signal, and wherein the method further comprises:
determining a frequency of the transient signal of the first reference signal; and
determining a cutoff frequency of the filter based on the frequency of the transient signal.

6. The method of claim 5, wherein the cutoff frequency is between about 5 times and about 10 times lower than the frequency of the transient signal.

7. The method of claim 5, wherein the cutoff frequency is between 60 MHz and 120 MHz.

8. A method, comprising:
generating, by a first reference source, a first reference signal for a first stage of a hybrid analog-to-digital convertor (ADC), wherein the first reference signal comprises a noise waveform caused by capacitive switching of the first stage of the hybrid ADC;
low-pass filtering, by a low-pass filter coupled to an output terminal of the first reference source, the first reference signal to produce a filtered first reference signal;
generating, by a second reference source coupled to an output of the low-pass filter, a second reference signal using the filtered first reference signal, the second reference signal being for a second stage of the hybrid ADC having a circuit architecture from the first stage of the hybrid ADC; and
storing, in a capacitive element coupled to an output terminal of the second reference source, an electrical charge for capacitive switching of the second stage of the hybrid ADC.

9. The method of claim 8, wherein the first stage of the hybrid ADC comprises a pipeline ADC, and wherein the second stage of the hybrid ADC comprises at least one of a successive-approximation register (SAR) ADC, an asynchronous SAR ADC, a time-interleaved SAR ADC, or a time-interleaved asynchronous SAR ADC.

10. The method of claim 8, wherein a cutoff frequency of the low-pass filter is between about 5 times and about to times lower than an inverse of a period of the noise waveform.

11. The method of claim 10, wherein the cutoff frequency is between 60 MHz and 120 MHz.

12. The method of claim 8, wherein the first reference source comprises at least one of a fully differential amplifier or a plurality of single-ended voltage followers.

13. The method of claim 8, wherein the second reference source comprises at least one of a fully differential amplifier or a plurality of single-ended voltage followers.

14. The method of claim 8, wherein the capacitive element is coupled between the output terminal of the second reference source and another output terminal of the second reference source.

15. The method of claim 8, wherein the capacitive element is coupled between the output terminal of the second reference source and a power supply potential.

16. The method of claim 8, further comprising:
determining, using the first stage of the hybrid ADC and the first reference signal, first bits of a digital representation of an analog signal received at the first stage of the hybrid ADC; and
determining, using the second stage of the hybrid ADC and the second reference signal, second bits of the digital representation of the analog signal.

17. The method of claim 16, wherein the digital representation is an N-bit digital representation of the analog signal, wherein the first bits comprise M most significant bits of the N-bit digital representation, and wherein the second bits comprise (N−M) least significant bits of the N-bit digital representation.

18. The method of claim 17, further comprising:
combining the M most significant bits and the (N−M) least significant bits to generate the N-bit digital representation using a digital error correction circuit coupled to the first stage of the hybrid ADC and the second stage of the hybrid ADC.

19. The method of claim 8, further comprising:
receiving a first analog signal at a first pipelined stage of the first stage of the hybrid ADC; and
amplifying a residue voltage at a last pipelined stage of the first stage of the hybrid ADC, the amplifying generating a second analog signal; and
providing the second analog signal as an input signal to the second stage of the hybrid ADC.

* * * * *

UNITED STATES PATENT AND TRADEMARK OFFICE
CERTIFICATE OF CORRECTION

PATENT NO. : 10,505,562 B2
APPLICATION NO. : 16/227495
DATED : December 10, 2019
INVENTOR(S) : Ashish Kumar Page 1 of 1

It is certified that error appears in the above-identified patent and that said Letters Patent is hereby corrected as shown below:

In the Claims

In Column 15, Lines 43-44, Claim 10, delete "between about 5 times and about to times" and insert --between about 5 times and about 10 times--.

Signed and Sealed this
Twenty-first Day of April, 2020

Andrei Iancu
*Director of the United States Patent and Trademark Office*